United States Patent [19]

Hill et al.

[11] Patent Number: 5,220,218
[45] Date of Patent: Jun. 15, 1993

[54] RADIATION TOLERANT COMPLEMENTARY MOS LOGIC FOR BIPOLAR/CMOS INTEGRATED CIRCUITRY

[75] Inventors: Kevin E. Hill, Vestal; Gary A. Stefura, Endicott, both of N.Y.

[73] Assignee: General Electric Company, Johnson City, N.Y.

[21] Appl. No.: 763,569

[22] Filed: Sep. 23, 1991

[51] Int. Cl.⁵ ............................................ H01L 25/00
[52] U.S. Cl. .................... 307/482.1; 357/34; 357/42; 357/43; 257/565; 257/378
[58] Field of Search .............. 307/482.1, 482; 357/42, 357/34, 43

[56] References Cited

U.S. PATENT DOCUMENTS 4,225,877 9/1980 Miles et al. ........................ 357/42
4,764,480 8/1988 Vora ................................... 357/42

Primary Examiner—Paul M. Dzierzynski
Assistant Examiner—R. A. Ratliff
Attorney, Agent, or Firm—Bernard E. Shay; Stephen A. Young

[57] ABSTRACT

A novel double diffused complementary MOS (DCMOS) logic family is disclosed which allows greater tolerance to total dose gamma radiation. The logic family may be fabricated in conventional power BiCMOS IC technology in which complementary power DMOS output devices and Bi-polar transistors are integrated with high performance complementary MOS devices to perform both digital and analog functions. The incorporation is achieved without the additional masks or process modifications normally required for improving radiation tolerance.

7 Claims, 5 Drawing Sheets

RADIATION TOLERANT COMPLEMENTARY MOS LOGIC FOR BIPOLAR/CMOS INTEGRATED CIRCUITRY

BACKGROUND OF THE INVENTION

1. Field of the Invention

The invention relates to Integrated Circuits in which complementary metal-oxide semiconductor (CMOS) logic is combined with Bi-polar devices and/or double diffused MOS (DMOS) power devices (i.e. BiMOS ICs) and more particularly to Radiation Tolerant Complementary MOS Logic for BiMOS Integrated Circuits.

2. Prior Art

IC technology which is capable of integrating complementary power DMOS output devices with high performance Bi-polar CMOS analog and digital components has recently been developed and successfully applied in a variety of applications. While this technology offers substantial performance improvements compared to implementations using conventional IC's, discretes, or hybrid designs, the on-chip CMOS logic limits its usefulness for applications which must meet tatical total dose gamma radiation requirements.

Requirements for military avionic control systems often include a total dose radiation specification. While the Power BiMOS IC technology offers unique advantages in the development of interface IC's, the polysilicon gate CMOS devices are not radiation tolerant. The principal effects of radiation in MOS devices are changes in the threshold voltage, flatband voltage and channel mobility due to trapped charge in the gate insulator. Radiation-induced threshold shift is the prime concern in the operation of CMOS devices. For both PMOS and NMOS transistors, radiation causes the threshold voltage to shift toward more negative values. The PMOS transistor becomes harder to turn-on. Conversely, the NMOS threshold shifts towards becoming a depletion mode device where it is permanently turned-on. The physical phenomena for this behavior is that radiation produces electron-hole pairs in the $SiO_2$ gate insulator. A fraction of the holes become trapped in the $SiO_2$, as the various gate induced fields sweep out the electrons as part of normal circuit operation. The trapped positive charge build-up in the $SiO_2$ gate layer adjacent to the channel causes the threshold to shift toward more negative gate voltages. This effect is accentuated by the fact that, in the NMOS transistor the trapped charges migrate toward the silicon-insulator interface, but in the PMOS transistor they migrate toward the polysilicon gate. Hence the PMOS transistor is inherently more radiation-resistant than the NMOS for this reason. Conventional NMOS devices typically fail at 1 krad (Si) with the upper limit for safe operation at 1-3 krads. Several techniques have been developed to extend the radiation tolerance of silicon-based CMOS, these include the use of aluminum gates, minimizing the gate oxide thickness, ion implantation techniques, and fixed well potentials. These methods are not easily adaptable to the Power BiMOS technology since most require fundamental processing changes which would jeopardize the performance of the Bipolar and DMOS devices.

SUMMARY OF THE INVENTION

Accordingly it is an object of the present invention to provide improved Bi-polar CMOS integrated circuitry.

It is another object of the invention to provide improved CMOS logic in Bi-polar CMOS integrated circuitry.

It is still another object of the invention to provide radiation tolerant CMOS logic in Bi-polar CMOS integrated circuitry.

It is a further object of the invention to provide radiation tolerant CMOS logic which can be produced by a conventional BiMOS process without requiring additional process modifications or additional masks.

These and other objects of the invention are achieved in an integrated circuit process capable of combining serially connected complementary metal oxide semiconductor (MOS) active devices, Bi-polar transistors, and double diffused MOS power devices. The novelty in an integrated circuit formed by this process, comprises a combination of a doubly diffused NMOS device in combination with a conventional PMOS device to achieve radiation tolerance.

The integrated circuit utilizes a P type substrate having a patterned N+ region formed therein and a lightly doped N type epitaxial layer formed thereon. Conventional P-channel MOS devices are formed using a lightly diffused N-well formed in the N type epitaxial layer.

The novel N-channel MOS (NMOS) devices are formed using a lightly diffused P-well formed in the same epitaxial layer. In accordance with the invention, an additional P-body diffusion having a doping concentration intermediate to that of the source contact diffusion and that of the P-well is provided. A P+/N+ contact diffusion formed within the P-body diffusion formed with the P-well completes the source and the P-well contact. Aside from the double diffusion and adjustments in dimensions to optimize the circuit operation, the remainder of the NMOS device is conventional.

The additional P-body increases the dc threshold of the NMOS device and delays the onset of depletion mode operation when the integrated circuit is exposed to gamma radiation. The additional P-body diffusion comes at negligible complication of conventional BiMOS processing. The double diffused MOS circuitry is applicable to common CMOS logic circuits.

BRIEF DESCRIPTION OF THE DRAWINGS

The inventive and distinctive features of the invention are set forth in the claims of the present application. The invention itself, however together with further objects and advantages thereof, may best be understood by reference to the following description and accompanying drawings, in which:

FIG. 5A being an inverter; FIG. 5B being a two input NOR gate; FIG. 5C being a two input exclusive OR gate; FIG. 5D being a two input NAND gate; and FIG. 5E being a SCHMITT trigger.

DESCRIPTION OF THE PREFERRED EMBODIMENT

Figure 1:
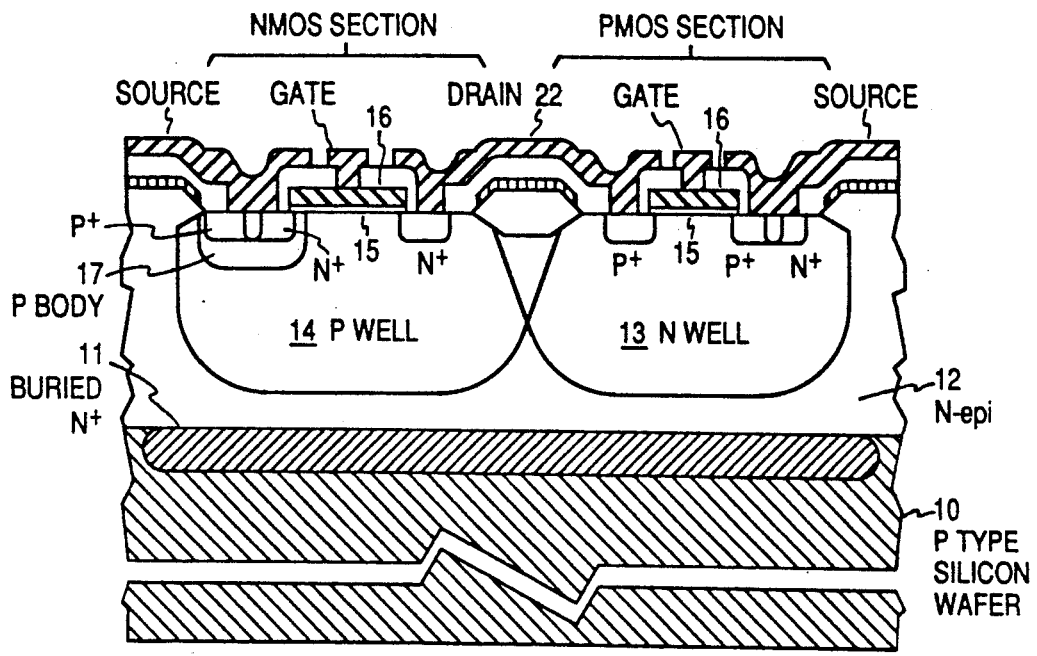
FIG. 1 is a cross-section of a novel complementary metal oxide semiconductor configuration in an integrated circuit, doubly diffused in accordance with the invention to enhance the tolerance of the circuit to exposure to radiation, the configuration being formed by a bipolar-MOSFET process which permits combining CMOS logic, Bi-polar transistors and DMOS power transistors.

A cross-section of a novel complementary metal oxide semiconductor (CMOS) configuration doubly diffused in accordance with the invention and which will be termed a "DCMOS" configuration, is illustrated in FIG. 1.

The novel DCMOS configuration exhibits an enhanced tolerance to exposure to radiation, doubling the normal 13K rad tolerance of a convential CMOS inverter. This technique doubles the tolerance and allows tactical radiation levels to be achieved. The DCMOS logic herein disclosed continues to function through an exposure of 30 krads.

The DCMOS configuration illustrated in FIG. 1 is a part of an integrated circuit formed by a Bi-polar MOSFET (Bi-MOS) process. The BiMOS process taken as a whole, is conventional, and additional steps are not required to obtain the novel DCMOS configuration illustrated in FIG. 1. (The processing of the integrated circuit will be explained concurrently with descriptions of the different device structures.)

The integrated circuit utilizes as a starting material a <100> oriented, lightly doped P-type silicon substrate 10. The upper surface is oxidized, and patterned for N+ implanting. The N+ implanted layer 11 provides isolation for the N-MOS devices from the substrate and buried electrodes for the Bi-polar devices. Following implanting, a lightly doped epitaxial layer 12 is grown.

Figure 2:
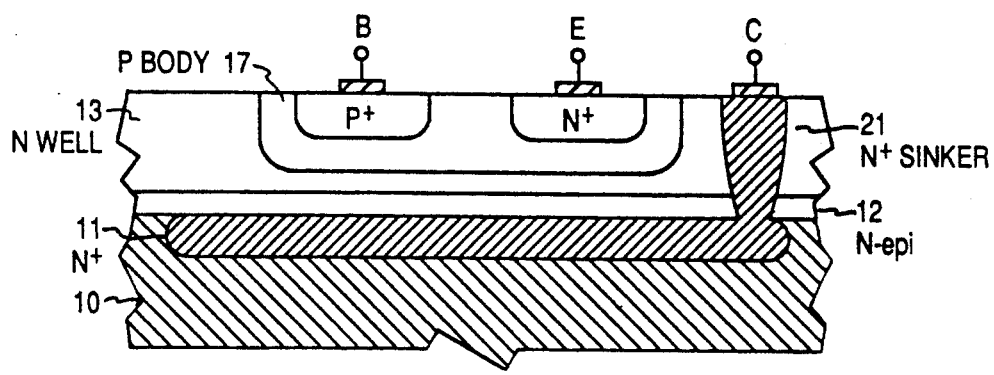
FIG. 2 is a cross-section of a vertically developed NPN transistor formed by the same Bi-polar MOSFET process employed in making the inventive embodiment illustrated in FIG. 1.
Figure 3:
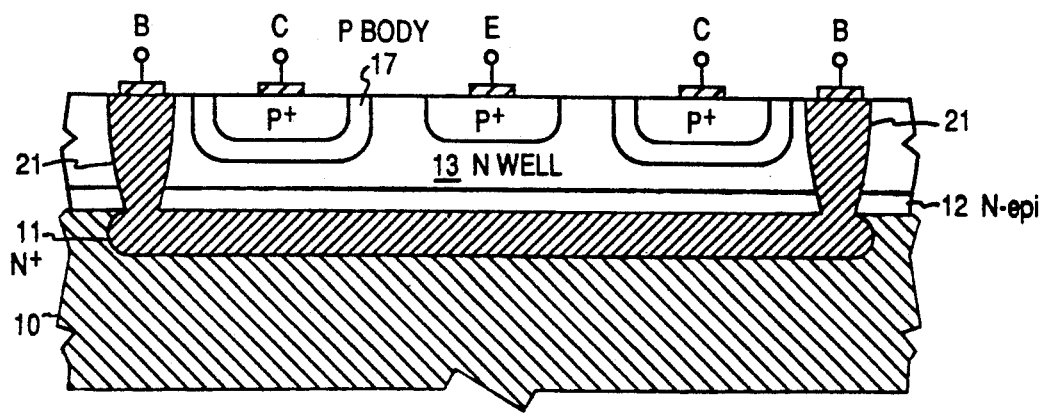
FIG. 3 is a cross-section of a lateral PNP transistor of a circular geometry formed by the same Bi-polar process mentioned above.

Further features of the active devices and isolation between the active devices takes place within and upon the epitaxial layer. In particular, downward extending P+ isolation barriers (41) between devices and N+ connections 21 (i.e. "sinkers") between surface contacts and the now buried N+ implants 11 (illustrated in FIGS. 2, 3, and 4) are formed. Next the intermediately doped N wells 13 and P wells 14 are implanted. The wells serve as channels for conventional CMOS structures (should any be present) and DCMOS and drift regions for the DMOS power structures. A patterned gate oxide 15 is then formed, and polysilicon gates 16 are formed over the gate region for the MOS devices.

Next the P-bodies 17 and N-bodies 18 are implanted. The P-body 17 is formed as the collector region of the PNP transistor shown in FIG. 3, and is formed around the source of the DCMOS device in FIG. 1. These steps and the resulting structures are well known.

Figure 4:
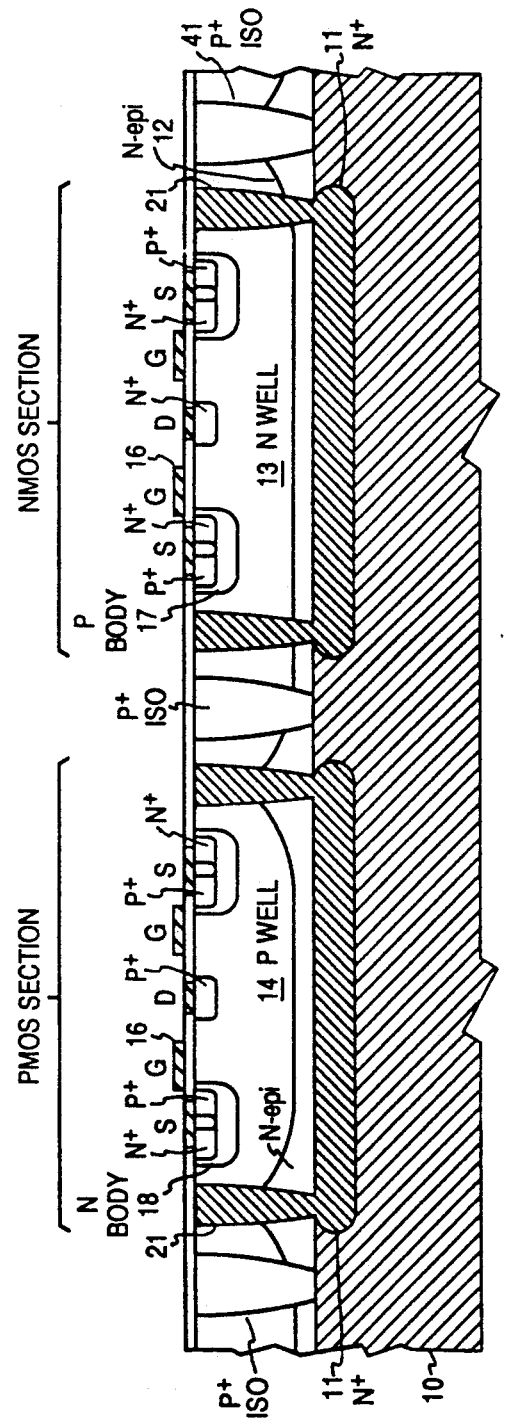
FIG. 4 is a cross-section of a power DMOS transistor configuration, each device being of a circular geometry formed by the same Bi-polar process mentioned above.

In the DMOS power device of FIG. 4 the N-body implants 18 form the diffused channel region of the PMOS section and the P-body implants 17 form the diffused channel region of the NMOS section. The remainder of the regions of the N and P wells underlying the gate electrodes form a drift region, with the actual control taking place in the N and P bodies. In the Bi-polar NPN devices, the P-body 17 forms the base region in which the emitter electrode is made.

In order to achieve greater tolerance of the CMOS logic to exposure to radiation, and in accordance with the invention, a P-body 17 is also formed about the source of the N channel MOS (NMOS) device. This novel structure, as will be described, enhances the switching threshold of the DCMOS devices, and improves the performance of the logic circuits when exposed to radiation.

The implanting of the N-body and P-bodies is followed by a heating process which drives in the P-body to the desired depth to accommodate the shallow N+ and P+ implantations. In the vertical NPN Bi-polar transistor, the P+ implantation contacts the P-body, and the N+ implantation forms the emitter. In the lateral PNP, a P+ implantation contacts the P-body and forms the collector, and P+ implantation formed in the N-well layer forms the emitter.

In the DMOS power devices, overlapping N+/P+ implantations formed in the N-body in the P-well of the P-MOS device form the source and N-body contact and overlapping N+/P+ implantations formed in the P-body in the N-well of the N-MOS device form the source and P-body contact.

The final step in fabricating a Bi-CMOS integrated circuit having some or all of the transistor configurations illustrated in FIGS. 1 to 4 include the formation of a polysilicon layer for formation of accurate capacitors, two layers of metallization for interconnection, contacts, vias and passivation.

Figure 6:
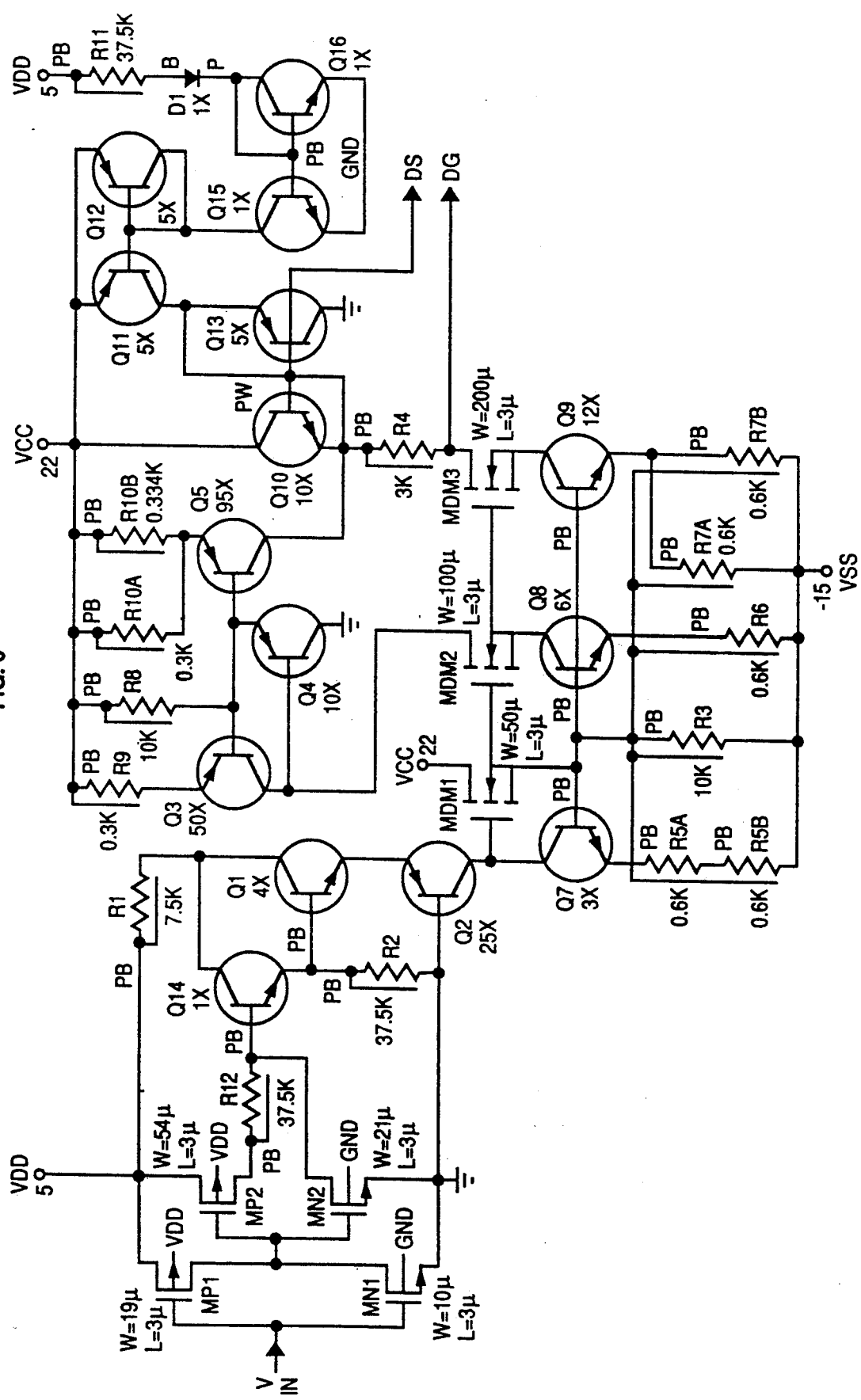
FIG. 6 is an illustration of a circuit in which switching of significant power is achieved under the control of high input impedance CMOS logic, the circuit being formed in a single integrated circuit combining doubly diffused CMOS, Bi-polar and DMOS power devices.

A typical application of the invention is shown in FIG. 6, which is a switch driver cell within an IC incorporating other cells, and a large geometry DMOS power device, also not shown. In the illustrated configuration DCMOS elements MP1, MP2, MN1, MN2 and Bi-polar transistors Q14, Q1 and Q2 form a logically controlled switched current source which provides bias for the remainder of the illustrated circuit.

The switched current source accepts five volt logic inputs from logic located in a digital portion of the integrated circuit. The initial DCMOS stages of the current source thus operate at the normal high impedances characteristic of DCMOS devices and they provide control of the Bi-polar transistors Q14, Q1 and Q2, which form the current source for the switch driver.

The current from the switched current source is then mirrored to provide a well controlled gate/source voltage for a larger DMOS power device in another cell as indicated by the arrows DS and DG which go respectively to the gate and source of a DMOS power device. The DMOS power device is fully turned on when the DC voltage applied to the gate is set near −7 volts with respect to the source voltage. The DMOS power device is turned-off when the gate voltage climbs to the source voltage and the difference approximates zero volts. A well controlled gate/source voltage, which is provided by the illustrated source driver insures against overstressing the gate oxide and insures reliability. The switch driver consists of additional Bi-polar transistors including both NPNs and PNP and includes DMOS devices MDM1, MDM2 and MDM3.

Figure 5A:
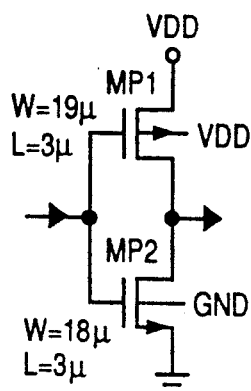
FIGS. 5A thru 5E are five typical logic circuits exhibiting enhanced tolerance to exposure to radiation, employing the doubly diffused CMOS configuration illustrated in FIG. 1.
Figure 5B:
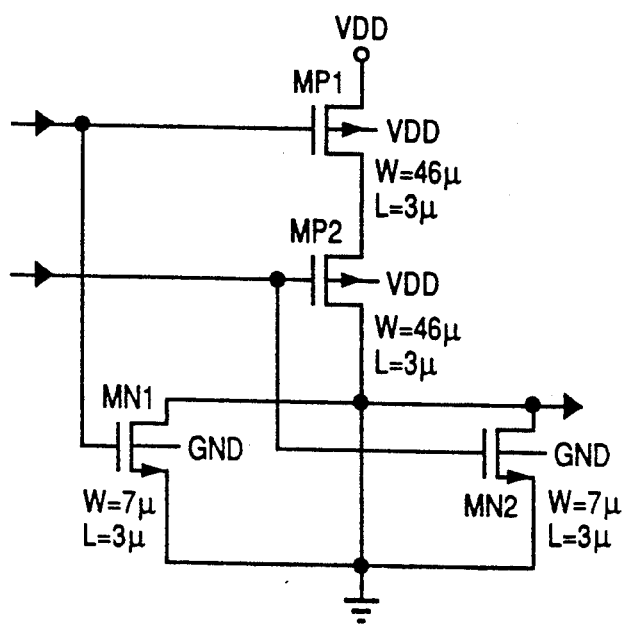
Figure 5C:
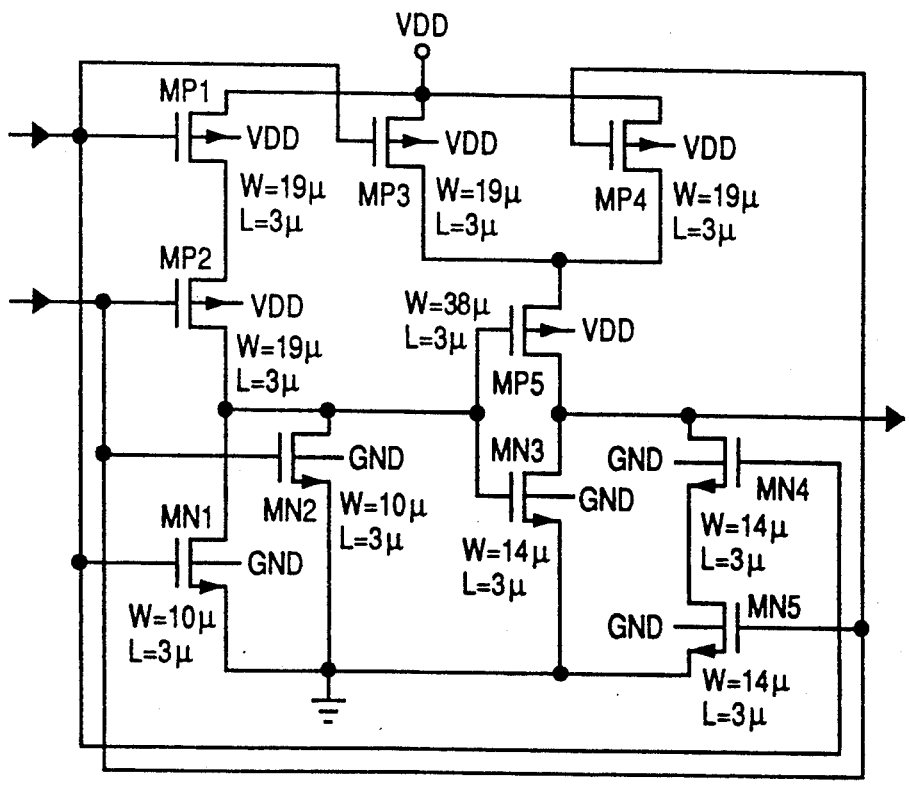
Figure 5D:
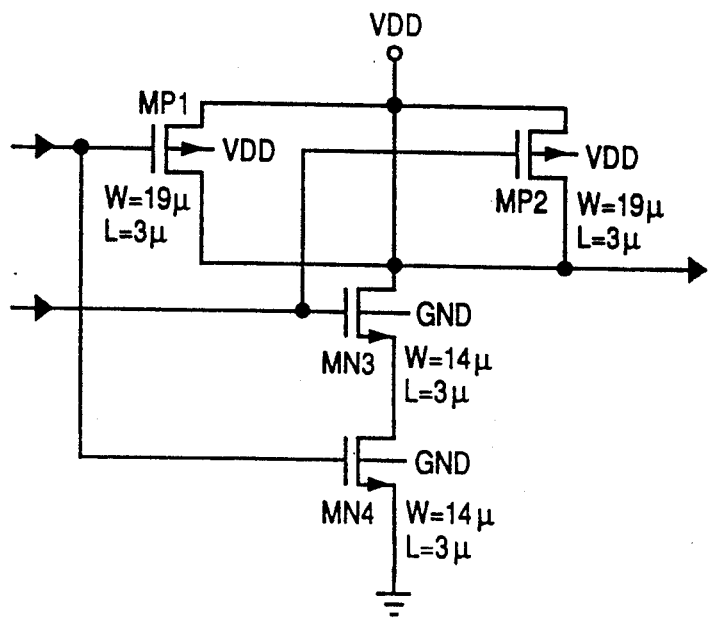
Figure 5E:
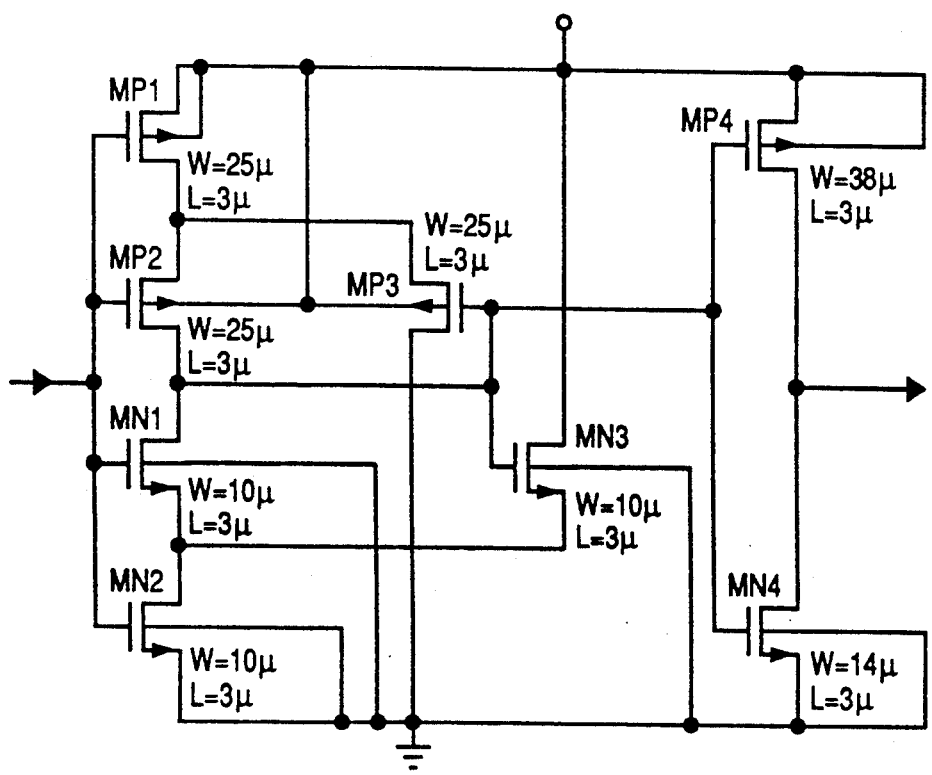

FIGS. 5A-5E illustrate five typical logic circuits incorporating the invention and exhibiting enhanced tolerance to exposure to radiation. The circuits employ a doubly diffused CMOS configuration in accordance with the invention. FIG. 5A illustrates an inverter; FIG. 5B illustrates a two port NOR gate; FIG. 5C illustrates a two port exclusive OR gate; FIG. 5D illustrates a two port NAND gate; and FIG. 5E illustrates a Schmitt trigger. The drawings illustrate the circuit connections and the device dimensions, including the gate width and gate length.

The structure of the DCMOS logic is exemplified in FIG. 1 in which an NMOS device is pictured to the left and a PMOS device is pictured to the right. The two devices shown in FIG. 1 are connected together at the drains by surface metallization 22 in a manner consistent with the inverter circuit illustrated in FIG. 5A, which will now be considered.

As illustrated in FIG. 5A, an NMOS and a PMOS device are connected in series between a positive drain supply (VDD), typically +5 volts and the DC common connection at zero or ground potential. The source of the PMOS device is connected to the VDD supply, the source of the NMOS device is connected to ground, and the drains of the two devices are connected together. In addition, the gates of the two devices are connected together.

In operation, an input signal applied to the two gate electrodes produces an output signal of opposite sense at the common drain output connection. If a logical "high" is applied to the gates, the NMOS device is turned on, and the PMOS device is turned off, and the output goes to zero or ground potential producing a logical "low" output. If a logical "low" is applied to the gates, the PMOS device is turned on, the NMOS device is turned off and the output goes to the positive VDD voltage. In a conventional CMOS inverter, the threshold for the PMOS device is typically $-0.6$ to $-1.0$ volts gate voltage referenced to the source (at VDD potential) and the threshold for the NMOS device is typically $+0.6$ to $+1.0$ volt gate voltage referenced to the source (at ground potential).

Returning to FIG. 1 which shows the DCMOS logic structure; a conventional PMOS and a modified NMOS are shown. The NMOS is similar to conventional NMOS with the exception that a self aligned body implant 17 of the same polarity as the well has been introduced at the source end of the channel. The body regions are formed from the same processing steps used to fabricate the power DMOS diffused channels so no additional masks are required. In the double diffused NMOS structure the body implant is more heavily doped than the well, requiring more gate potential to invert the channel and thus yielding a higher threshold voltage. Typical DCMOS threshold voltages for the PMOS and NMOS are $-0.8$ volts and 1.9 volts respectively.

Figure 7B:
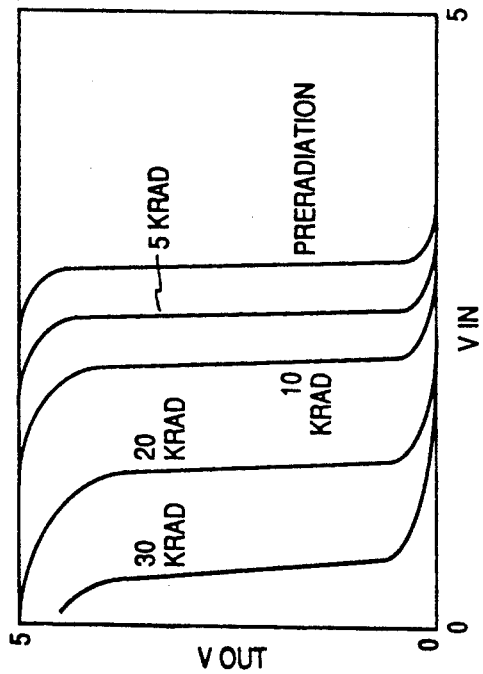
FIGS. 7A and 7B show characteristics for conventional CMOS (7A) and novel (7B) DCMOS devices exposed to different levels of total dose gamma radiation.
Figure 7A:
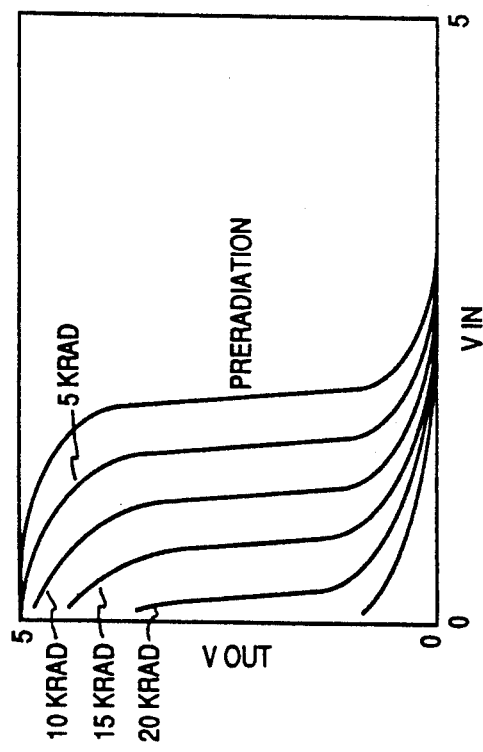

Typical inverter switching characteristics for conventional CMOS and the novel DCMOS logic family exposed to different levels of total dose gamma radiation are illustrated in FIGS. 7A and 7B. The input voltage (Vin) is measured along the horizontal axis and the output voltage (Vout) is measured along the vertical axis.

In FIG. 7A, the plot labelled pre-radiation is of a conventional CMOS inverter. For the conventional CMOS logic, the N-channel device reaches a depletion mode state at approximately 4 krads (Si). However, despite its weakened characteristics, the P-channel device still has sufficient gm to overcome the N-channel device and reasonable switching characteristics exist up to about 15 krads. At 20 krad, the maximum output voltage is about 4 volts and is unsatisfactory for positive bistable operation. At 30 krads the output voltage hardly exceeds a volt as the NMOS device overpowers the weakened PMOS device.

The DCMOS logic family, whose unique structure is illustrated in FIG. 1, represents a modification of the Power BiMOS technology. The unique structure minimizes the effect of post radiation threshold shift on circuit performance of ICs using this technology. The principle involved is that maximum radiation tolerance can be obtained by a logic family with a low threshold PMOS and a NMOS with a relatively high threshold voltage to avoid the problems earlier adverted to. Upon radiation the threshold voltage of the PMOS will still decrease in magnitude, however the NMOS threshold, which is normally the limiting factor in radiation tolerance, is higher and hence can tolerate more radiation before becoming depletion mode.

Total dose radiation testing of both conventional CMOS and DCMOS logic showed an average degradation in threshold voltage of $-0.2$ V/5 krad (Si) for the P-channel devices and $-0.6$ V/5 krad (Si) for the N-channel devices.

FIG. 7B illustrates the greater tolerance of the novel DCMOS logic to total dose gamma radiation. While the pre-radiation switching threshold has been shifted to the right by a volt, good bistable performance continues through to 30 krads.

The design of DCMOS logic entails a modification of the device dimensions over that of conventional CMOS to optimize performance. Returning to FIG. 5A, the exemplary CMOS configuration shown utilizes "3 micron geometry" with the gate width of the PMOS device MP1 being 19 microns with that of the NMOS device being 10 microns, slightly over half that of the other device. In the design of a DCMOS logic element, the configuration of the individual MOS transistors is first generated to achieve the desired logic function. This involves a selection of circuits from the representative set illustrated in FIGS. 5A-5B. Then, the widths of the N and P-channel devices are scaled to maximize input noise immunity, to minimize supply current drain during output transitions, and to achieve the desired switching speed and output drive capability. In the transition from a CMOS element to the DCMOS logic configuration, the performance parameters are re-analyzed and the devices re-scaled to account for the N-channel devices higher threshold voltage.

What is claimed is:

1. In an integrated circuit containing serially connected complementary metal oxide semiconductor (MOS) active devices, a novel combination exhibiting improved radiation tolerance comprising:
   1) a first terminal for application of positive dc potentials,
   2) a second terminal for application of negative dc potentials,
   3) a P type substrate having a patterned N+ region formed therein, and a lightly doped N type epitaxial layer formed thereon, A) at least one P-channel MOS (P-MOS) device having a lightly diffused N-well formed in said N type epitaxial layer, and comprising
   i) a P+/N+ contact diffusion in said N-well to form a source and an N-well contact, the source of at least one P-channel device being connected to said first terminal, and
   ii) a P+ contact diffusion in said N-well to form a drain, and
   iii) a gate region over said N-well disposed between said source and drain diffusions; and
B) at least one N-channel MOS (N-MOS) device having a lightly diffused P-well formed in said epitaxial layer, and comprising
   i) a P+/N+ contact diffusion formed within a P-body diffusion formed within said P-well to form a source and a P-well contact,
   ii) an N+ diffusion in said P-well to form a drain, the drain of at least one P-channel device being connected to a drain of at least one N-channel device, and
   iii) a gate region over said P-well disposed between said source and drain diffusions;
said P-body diffusion having a doping concentration intermediate to that of said P+ contact diffusion and that of said P-well,
the sources of at least one N-channel device being connected to said second terminal to effect at least one serial connection of a P-MOS and a N-MOS device between said terminals.

2. The combination set forth in claim 1, wherein
1) said P-MOS device is designed to have a relatively low switching threshold, and
2) said N-MOS device has a relatively high switching threshold, provided by said P-body to effect a greater radiation tolerance in operation of said N-MOS device before undesired depletion mode operation occurs causing the logic switching threshold to fall and failure of the CMOS logic.

3. The combination set forth in claim 1, having in addition thereto
C) at least one Bi-polar transistor device formed in said N-type epitaxial layer having base, emitter, and collector electrodes, at least one electrode of which utilizes a P+ contact diffusion formed within a P-body diffusion,
said P-body diffusion having a doping concentration intermediate to that of said P+ contact diffusion and that of said P-well and being formed in the same process step as the P-body diffusion in said at least one N-MOS device.

4. The combination set forth in claim 1 having in addition thereto
C) at least one doubly diffused metal oxide semiconductor device (DMOS) formed in said epitaxial layer having source, gate and drain electrodes, the electrodes being formed on an N-well, the source electrode having a P+/N+ contact diffusion formed within a P-body diffusion,
said P-body diffusion having a doping concentration intermediate to that of said P+ contact diffusion and that of said P-well and being formed in the same process step as the P-body diffusion in said at least one N-MOS device.

5. The combination set forth in claim 1, wherein one P-channel MOS device, and one N-channel MOS device are serially connected to effect inverter operation.

6. The combination set forth in claim 1, wherein two P-channel MOS devices are provided mutually serially connected in a first circuit, and two N-channel MOS devices are provided mutually connected in parallel in a second circuit,
the first and second circuits being serially connected in the order recited between said first and second terminals to effect NOR gate operation.

7. The combination set forth in claim 1, wherein two P-channel MOS devices are provided mutually connected in parallel in a first circuit, and two N-channel MOS devices are provided serially connected in a second circuit,
the first and second circuits being serially connected in the order recited between said first and second terminals to effect NAND gate operation.

* * * * *